US008969730B2

(12) United States Patent
Montevirgen et al.

(10) Patent No.: US 8,969,730 B2
(45) Date of Patent: Mar. 3, 2015

(54) PRINTED CIRCUIT SOLDER CONNECTIONS

(75) Inventors: Anthony S. Montevirgen, San Francisco, CA (US); Emery A. Sanford, San Francisco, CA (US); Stephen Brian Lynch, Portola Valley, CA (US)

(73) Assignee: Apple Inc., Cupertino, CA (US)

(*) Notice: Subject to any disclaimer, the term of this patent is extended or adjusted under 35 U.S.C. 154(b) by 250 days.

(21) Appl. No.: 13/587,793

(22) Filed: Aug. 16, 2012

(65) Prior Publication Data

US 2014/0048310 A1 Feb. 20, 2014

(51) Int. Cl.
| H05K 1/00 | (2006.01) |
| H05K 1/14 | (2006.01) |
| H05K 1/02 | (2006.01) |
| H05K 3/36 | (2006.01) |
| H05K 1/11 | (2006.01) |
| H05K 3/34 | (2006.01) |

(52) U.S. Cl.
CPC ............... *H05K 1/14* (2013.01); *H05K 1/0218* (2013.01); *H05K 3/363* (2013.01); *H05K 1/118* (2013.01); *H05K 1/147* (2013.01); *H05K 3/3494* (2013.01); *H05K 2201/09481* (2013.01); *H05K 2201/10666* (2013.01); *H05K 2201/10977* (2013.01); *H05K 2203/0195* (2013.01); *H05K 2203/1147* (2013.01); *H05K 2203/1311* (2013.01)
USPC ........... 174/250; 174/378; 174/261; 174/262; 174/263; 174/528; 361/679; 361/753; 361/768; 257/668; 257/678; 257/679; 257/686; 257/738; 29/827; 29/846

(58) Field of Classification Search
USPC .......... 174/250, 378, 261–263, 528; 361/679, 361/753, 768; 257/668, 678, 679, 686, 738; 29/827, 846
See application file for complete search history.

(56) References Cited

U.S. PATENT DOCUMENTS

| 5,474,958 | A | * | 12/1995 | Djennas et al. | 29/827 |
| 6,157,080 | A | * | 12/2000 | Tamaki et al. | 257/738 |
| 6,384,339 | B1 | | 5/2002 | Neuman | |
| 6,966,482 | B2 | | 11/2005 | Totani et al. | |
| 7,323,364 | B2 | | 1/2008 | Partridge et al. | |
| 7,624,501 | B2 | * | 12/2009 | Machida | 29/846 |
| 7,807,499 | B2 | * | 10/2010 | Nishizawa | 438/107 |
| 8,003,446 | B2 | | 8/2011 | Autry | |
| 8,071,883 | B2 | | 12/2011 | Takahashi et al. | |
| 2002/0033525 | A1 | * | 3/2002 | Ohuchi | 257/679 |
| 2004/0231872 | A1 | * | 11/2004 | Arnold et al. | 174/35 R |
| 2008/0174977 | A1 | * | 7/2008 | Inoue | 361/768 |
| 2009/0102037 | A1 | * | 4/2009 | Kim | 257/686 |
| 2009/0152693 | A1 | * | 6/2009 | Sato | 257/668 |
| 2010/0148332 | A1 | * | 6/2010 | Kajiki | 257/678 |
| 2010/0294559 | A1 | * | 11/2010 | Izawa et al. | 174/378 |
| 2010/0308451 | A1 | * | 12/2010 | Kodani | 257/690 |
| 2012/0081864 | A1 | * | 4/2012 | Sakurai et al. | 361/753 |

* cited by examiner

*Primary Examiner* — Xiaoliang Chen
(74) *Attorney, Agent, or Firm* — Treyz Law Group; G. Victor Treyz; Kendall P. Woodruff

(57) ABSTRACT

Printed circuits may be electrically and mechanically connected to each other using connections such as solder connections. A first printed circuit such as a rigid printed circuit board may have solder pads and other metal traces. A second printed circuit such as a flexible printed circuit may have openings. Solder connections may be formed in the openings to attach metal traces in the flexible printed circuit to the solder pads on the rigid printed circuit board. A ring of adhesive may surround the solder connections. The flexible printed circuit may be attached to the rigid printed circuit board using the ring of adhesive. An insulating tape may cover the solder connections. A conductive shielding layer with a conductive layer and a layer of conductive adhesive may overlap the solder joints. The conductive adhesive may connect the shielding layer to the metal traces on the rigid printed circuit board.

14 Claims, 7 Drawing Sheets

PRINTED CIRCUIT SOLDER CONNECTIONS

BACKGROUND

This relates to electronic devices and, more particularly, to printed circuit solder connections for electronic devices.

Electronic devices such as cellular telephones and other devices include components that are mounted on printed circuits. Printed circuits are sometimes connected to each other using solder connections. If care is not taken, however, solder connections may be subject to environmental degradation or may not be effectively shielded from electromagnetic interference, leading to potential reliability and performance issues.

It would therefore be desirable to be able to provide improved techniques for environmentally sealing and electromagnetically shielding printed circuit structures with solder connections.

SUMMARY

Printed circuits may be electrically and mechanically connected to each other using connections such as hot bar solder connections. A first printed circuit such as a rigid printed circuit board may have solder pads and other metal traces. A second printed circuit such as a flexible printed circuit may have openings. Solder connections may be formed in the openings to attach metal traces in the flexible printed circuit to the solder pads on the rigid printed circuit board.

A ring of adhesive may surround and enclose the solder connections. The ring of adhesive may have a rectangular ring shape with a rectangular central opening or may have other suitable ring shapes. The flexible printed circuit may be attached to the rigid printed circuit board using the ring of adhesive.

An insulating tape may be attached over the solder connections. The insulating tape may include an insulating layer such as a polyimide layer or other polymer layer and an adhesive layer for attaching the polymer layer to the flexible printed circuit.

A conductive shielding layer may have a conductive layer and a layer of conductive adhesive. The conductive shielding layer may overlap the solder connections. The conductive adhesive may be used to connect the shielding layer to the metal traces on the rigid printed circuit.

The flexible printed circuit may overlap the ring of adhesive and may be depressed in the rectangular central opening. The insulating tape and, if desired, the conductive shielding layer may be configured to fit within the depression formed by the flexible printed circuit in the central opening of the adhesive ring.

Further features of the invention, its nature and various advantages will be more apparent from the accompanying drawings and the following detailed description of the preferred embodiments.

DETAILED DESCRIPTION

Electronic devices may be provided with printed circuits to which integrated circuits and other electrical components may be mounted. For example, components may be mounted to printed circuits such as rigid printed circuit boards (e.g., fiberglass-filled epoxy boards) and flexible printed circuits (e.g., sheets of polyimide or flexible layers of other polymers). Connectors such as board-to-board connectors and other connectors with mating contacts may be used to couple printed circuits together. Conductive adhesive and direct solder connections may also be used in forming electrical connections between printed circuits. As an example, printed circuits may be soldered together using hot-bar soldering techniques in which a heated tool (a hot bar) is brought into proximity of patterned solder paste on a printed circuit. As the solder paste is heated and reflows, hot bar solder joints may be formed to electrically and mechanically couple the printed circuits together.

Figure 1:
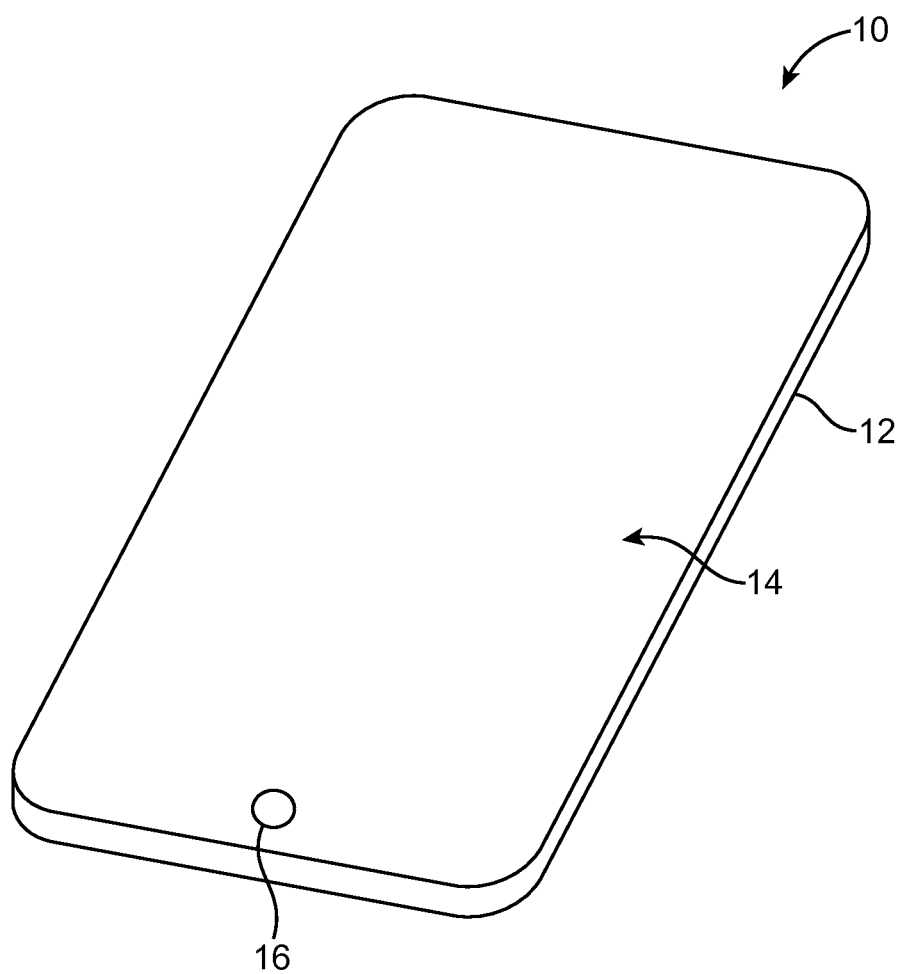
FIG. 1 is a front perspective view of an illustrative electronic device of the type that may be provided with printed circuit structures in accordance with an embodiment of the present invention.

An illustrative electronic device of the type that may be provided with electrical connections such as hot bar solder connections is shown in FIG. 1. Device 10 of FIG. 1 may be a handheld device such as a cellular telephone or media player, a tablet computer, a notebook computer, other portable computing equipment, a wearable or miniature device such as a wristwatch or pendant device, a television, a computer monitor, or other electronic equipment.

As shown in FIG. 1, electronic device 10 may include a display such as display 14. Display 14 may be a touch screen that incorporates a layer of conductive capacitive touch sensor electrodes or other touch sensor components or may be a display that is not touch-sensitive. Display 14 may include an array of display pixels formed from liquid crystal display (LCD) components, an array of electrophoretic display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16 and, if desired an opening may be used to form a speaker port. Device configurations without openings in display 14 may also be used for device 10.

Device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.).

Figure 2:
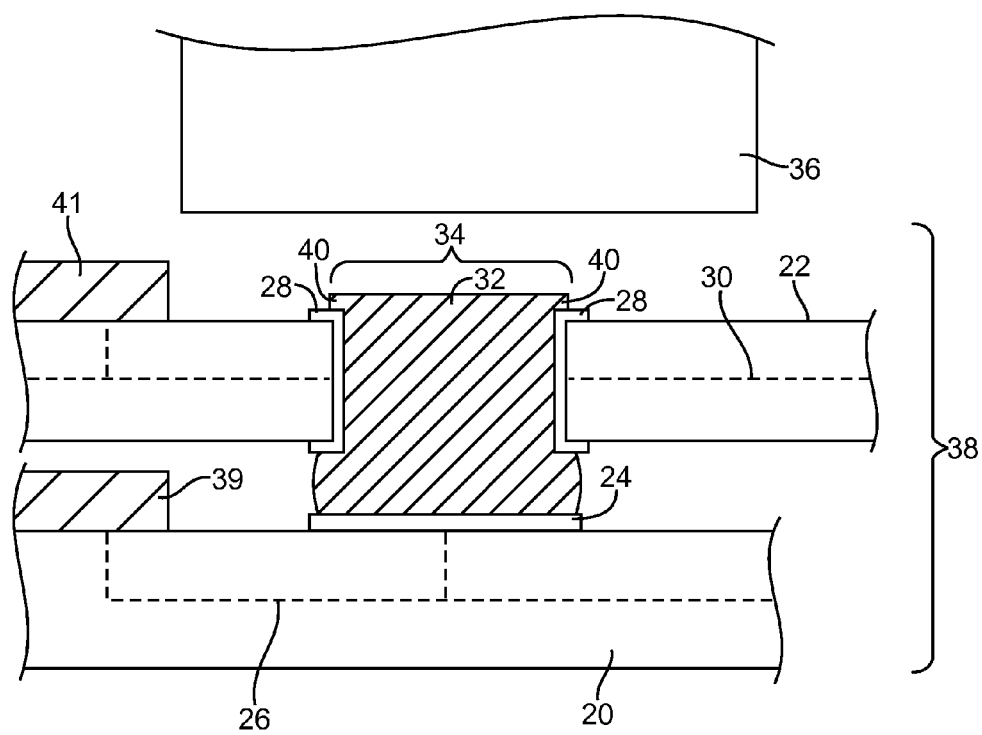
FIG. 2 is a cross-sectional view of a hot bar solder connection between a printed circuit board and a flexible printed circuit in accordance with an embodiment of the present invention.

FIG. 2 is a cross-sectional side view of printed circuit structures in device 10 showing how a hot bar soldering technique may be used to form connections between printed circuits in device 10. Hot bar 36 (e.g., a heated metal tool) may be used in applying heat to structures 38 to form solder connections. As shown in FIG. 2, structures 38 may include printed circuit 20 and printed circuit 22. Printed circuits such as printed circuits 20 and 22 may be rigid printed circuit boards, flexible printed circuits, rigid printed circuit boards with flexible printed circuit tails (sometimes referred to as rigid flex) or other suitable printed circuits or substrates. As an example, printed circuit 20 may be a rigid printed circuit board and printed circuit 22 may be a flexible printed circuit.

Printed circuit boards 20 and 22 may have signal paths (vias and patterned horizontal lines) that are formed from conductive materials such as metal. For example, printed circuit board 20 may have solder pad 24 and other metal traces 26. Printed circuit board 22 may have vias for solder connections formed from openings such as opening 34. The inner walls of openings such as opening 34 may, if desired, be coated with a layer of metal (e.g., using electroplating techniques or other metal deposition techniques). Metal 28 may be coupled to other metal traces 30 in board 22. Integrated circuits and other electrical components 39 and 41 may, if desired, be mounted to printed circuits 20 and 22 and may be coupled to metal traces 26 and 30, respectively. Printed circuits 20 and 22 may also be connected to additional printed circuit substrates (e.g., using solder, conductive adhesive, or connectors).

Solder 32 may be used to form an electrical connection (i.e., a solder joint) between traces 26 and traces 30. Initially, solder paste may be patterned on the surface of printed circuit board 20. Flexible printed circuit 22 may then be placed in the position shown in FIG. 2. With flexible printed circuit 22 in position, hot bar 36 may apply heat to reflow the solder paste, thereby forming solder joint 32 in opening 34 of printed circuit 22. When cooled and solidified, solder 32 may have a shape with protrusions such as protrusions 40 that overlap part of the surface surrounding opening 34 and thereby help to hold flexible printed circuit 22 in place on printed circuit board 20. Because hot bar solder connections between boards 20 and 22 such as solder connection 32 avoid the user of bulky connectors, the size of the connections that are made between boards 20 and 22 may be minimized.

Figure 3:
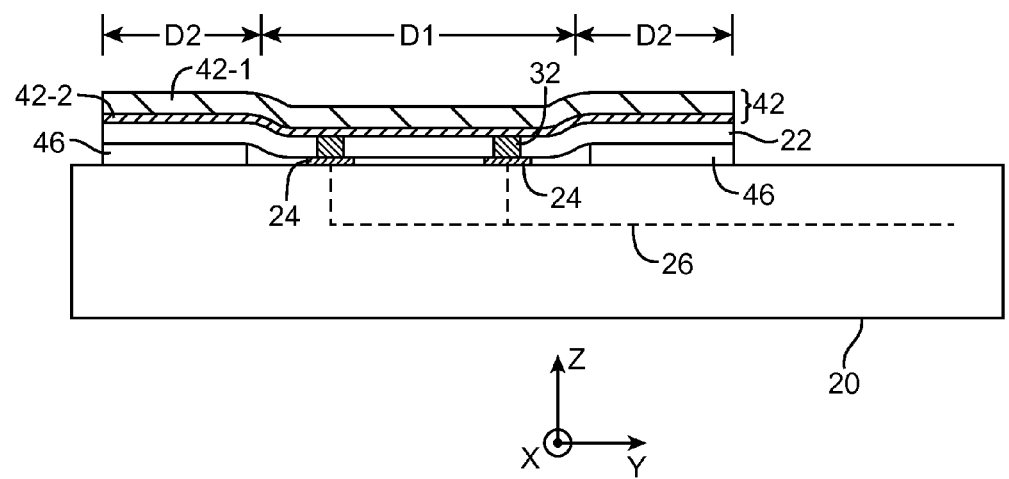
FIG. 3 is a cross-sectional view of a flexible printed circuit that has been mounted to a printed circuit board using hot bar solder connections covered with an insulating layer in accordance with an embodiment of the present invention.

To protect solder connections from environmental contaminants, environmental seals can be formed around the solder connections. As shown in FIG. 3, for example, hot bar solder connections 32 may be protected using a covering layer such as insulating layer 42. Insulating layer 42 may be, for example, a layer of polymer tape such as polyimide tape. Layer 42 may include a polymer layer such as layer 42-1 (e.g., a layer of polyimide) and an adhesive layer such as layer 42-2 (e.g., a pressure sensitive adhesive layer). The thickness of insulating layer 42 may be, for example, about 0.05 mm (or 0.03 mm to 0.1 mm or other suitable thickness). For example, if the total thickness of layer 42 is 0.05 mm, the thickness of layer 42-1 may be 0.04 mm and the thickness of layer 42-2 may be 0.01 mm (as an example).

Insulating layer 42 may cover the upper surface of flexible printed circuit 22 and hot bar solder connections 32, thereby insulating hot bar solder connections 32 from contact with conductive components and preventing undesirable short circuits between solder connections 32. The presence of insulating layer 42 may also prevent environmental contaminants from reaching solder connections 32.

The lower surface of flexible printed circuit 22 may be attached to the upper surface of printed circuit 20 using adhesive 46. Adhesive 46 may be formed from a material such as pressure sensitive adhesive and may form a sealing ring around the periphery of hot bar solder connections 32 that prevents environmental contaminants (e.g., moisture) from reaching connections 32 under flexible printed circuit 22.

The thickness of flexible printed circuit 22 may be about 0.1 mm or less than 0.2 mm (as examples). The thickness of adhesive ring 46 may be about 0.05 mm or less than 0.1 mm (as examples). The inner dimension of adhesive ring 46 (dimension D1 of the opening formed in the center of ring 46) may be about 2-10 mm. The width D2 of adhesive ring 46 may be about 1 mm (as an example).

Figure 4:
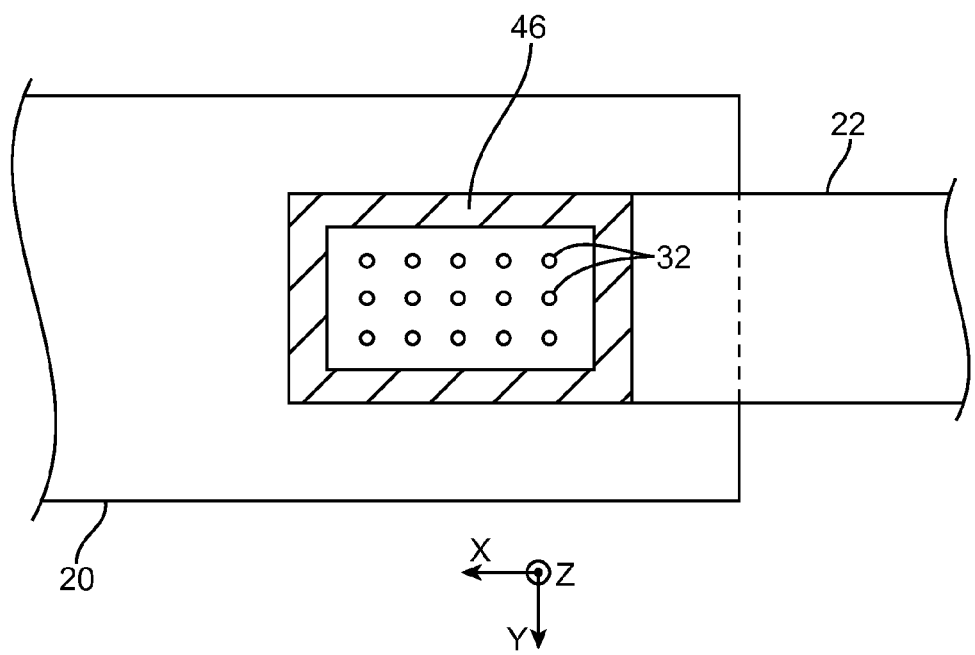
FIG. 4 is a top view of a flexible printed circuit mounted to a printed circuit board using hot bar solder connections covered with an insulating layer in accordance with an embodiment of the present invention.

Adhesive 46 may have the shape of a circular ring, a rectangular ring, or other shape that forms a seal around the periphery of hot bar solder connections 32. As shown in the top view of FIG. 4, for example, adhesive 46 may have the shape of a rectangular ring. Because layer 42 forms an environmental seal over the top of connections 32 and because ring 46 surrounds and encloses connections 32 to form an environmental seal around the periphery of connections 32, connections 32 may be sealed off from the environment. The sealing structures of FIG. 3 may therefore help to reduce corrosion and other damage to connections 32 that might otherwise arises if connections 32 were exposed to moisture and other environmental contaminants.

Printed circuit 20 may be provided with metal traces that form a signal ground. For example, printed circuit 20 may be provided with grounding pads such as pad 24' of FIG. 5. To electromagnetically shield hot bar solder connections 32 and thereby reduce electromagnetic interference, a shielding layer such as layer 50 may be used to cover some or all of hot bar solder connections 32.

Shielding layer 50 may have a conductive layer such as conductive layer 50-1 and an adhesive layer such as adhesive layer 50-2. Conductive shield layer 50-1 may be a layer of copper or other metal, may be a conductive fabric, may be a ferromagnetic material, or may be formed from other suitable conductive materials. Adhesive layer 50-2 may be a conductive adhesive layer that helps electrically connect layer 50-1 to a metal trace such as ground pad 24'.

Shielding layer 50 may overlap flexible printed circuit 22 and may be attached around the periphery of flexible printed circuit 22 using adhesive layer 50-2. With this configuration, shielding layer 50 may electromagnetically shield solder connections 32 and printed circuit traces 30. Shielding layer 50 may prevent radio-frequency electromagnetic interference signals generated at solder connections 32 and traces 30 from radiating and thereby interfering with nearby components and may prevent radio-frequency electromagnetic interference signals from nearby components from reaching solder connections 32 and traces 30.

Figure 5:
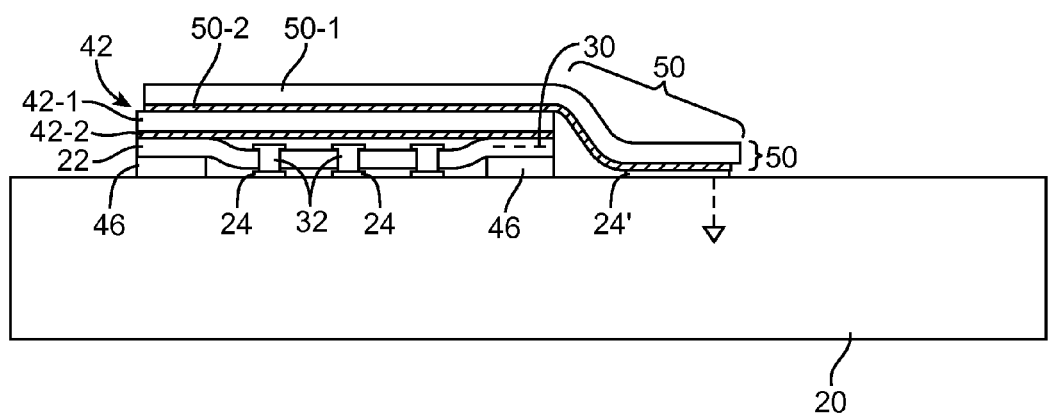
FIG. 5 is a cross-sectional side view of an illustrative electromagnetically shielded and environmentally sealed hot bar solder connection between a flexible printed circuit and a printed circuit board in accordance with an embodiment of the present invention.

As shown in FIG. 5, shielding layer 50 may be mounted on top of insulating layer 42 so that solder connections 32 may be both shielded and insulated from environmental exposure. In the illustrative configuration of FIG. 5, tail portion 50T of shielding layer 50 has been used to ground shielding layer 50 to grounding pad 24'. If desired, tail portion 50T may be omitted.

Figure 6:
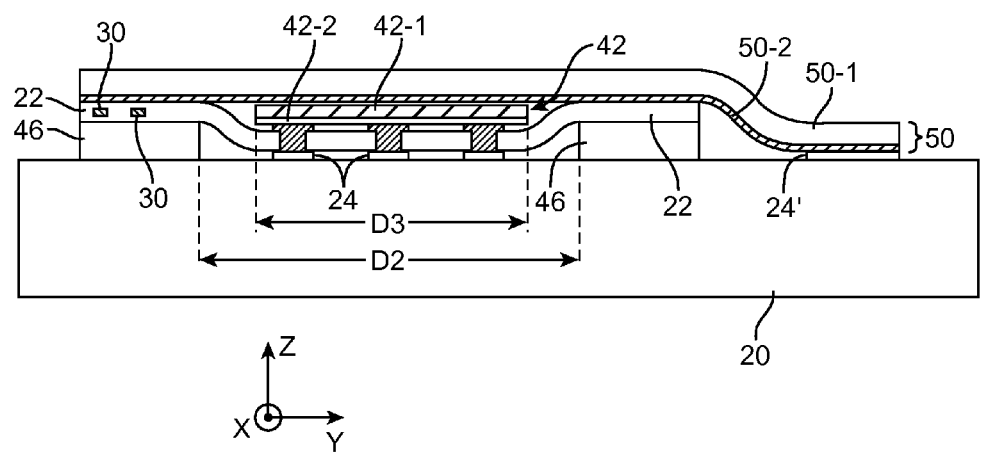
FIG. 6 is a cross-sectional side view of an illustrative electromagnetically shielded and environmentally sealed hot bar solder connection between a flexible printed circuit and a printed circuit board in a configuration that minimizes thickness in accordance with an embodiment of the present invention.

FIG. 6 shows how insulating cover layer 42 may have a lateral dimension D3 in the X-Y plane that is smaller than dimension D2. With this type of configuration, insulating layer 42 may fit into the depression in flexible printed circuit 22 that is formed within the center opening of ring 46. Because the thickness of layer 42 is at least partly located in the extra space made available by the depression in flexible printed circuit layer 42, overall thickness for the structures under shield layer 50 may be minimized. Shielding layer 50 may cover traces 30 in flexible printed circuit 22 and solder connections 32, thereby reducing interference.

Figure 7:
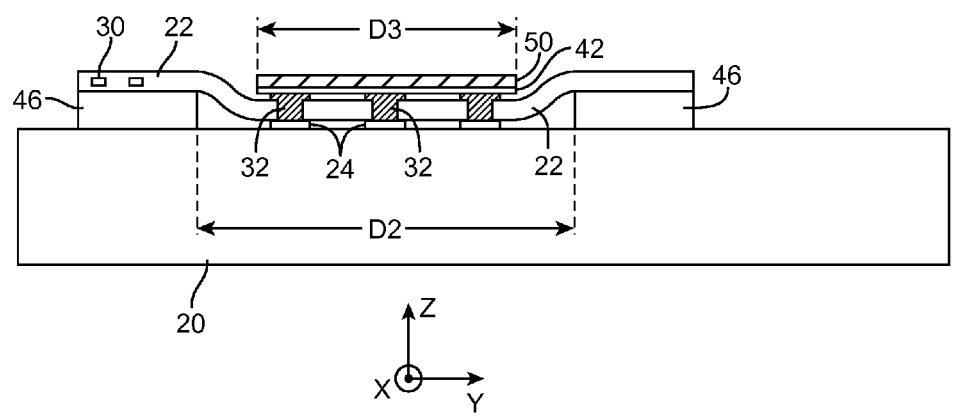
FIG. 7 is a cross-sectional side view of an illustrative electromagnetically shielded and environmentally sealed hot bar solder connection between a flexible printed circuit and a printed circuit board in a configuration in which shielding and sealing layers have reduced lateral dimensions to help minimize thickness in accordance with an embodiment of the present invention.

As shown in FIG. 7, both electromagnetic shielding layer 50 and insulating layer 42 may have a size (e.g., dimension D3 in the X-Y plane) that is less than dimension D2. This allows both shielding layer 50 and insulating layer 42 to fit (at least partly) within the depression formed where flexible printed circuit 22 conforms to the surface of printed circuit 20 within the central opening of adhesive ring 46.

The foregoing is merely illustrative of the principles of this invention and various modifications can be made by those skilled in the art without departing from the scope and spirit of the invention. The foregoing embodiments may be implemented individually or in any combination.

What is claimed is:

1. Apparatus, comprising:
   a first printed circuit;
   a second printed circuit;
   solder connections between the first and second printed circuits; and
   an adhesive ring that that is interposed between the first and second printed circuits and that surrounds the solder connections, wherein the adhesive ring has a central opening, and wherein the second printed circuit has a recessed portion that extends into the central opening.

2. The apparatus defined in claim 1 further comprising an insulating layer that overlaps the solder connections.

3. The apparatus defined in claim 2 wherein the first printed circuit comprises a rigid printed circuit board and wherein the second printed circuit comprises a flexible printed circuit and wherein the adhesive ring is attached to the flexible printed circuit and is attached to the rigid printed circuit board.

4. The apparatus defined in claim 3 wherein the flexible printed circuit comprises openings and wherein the solder connections comprise solder in the openings.

5. The apparatus defined in claim 4 further comprising an electromagnetic shielding layer that overlaps the insulating layer.

6. The apparatus defined in claim 5 wherein the shielding layer comprises a conductive layer and a layer of conductive adhesive.

7. The apparatus defined in claim 6 wherein the conductive layer comprises a metal layer.

8. The apparatus defined in claim 7 further comprising a metal pad on the rigid printed circuit, wherein the layer of conductive adhesive attaches the metal layer to the metal pad.

9. Apparatus, comprising:
   a first printed circuit;
   a second printed circuit;
   solder connections between the first and second printed circuits;
   a ring of adhesive that that is interposed between the first and second printed circuits and that surrounds the solder connections;
   an insulating layer that overlaps the solder connections; and
   a shielding layer that overlaps the solder connections and that overlaps the ring of adhesive, wherein the shielding layer includes a conductive layer and a layer of conductive adhesive that attaches the conductive layer to the insulating layer, and wherein the insulating layer has a polymer layer and an adhesive layer.

10. The apparatus defined in claim 9 wherein the insulating layer comprises a layer of polymer tape.

11. Apparatus, comprising:
    a first printed circuit;
    a second printed circuit;
    solder connections between the first and second printed circuits;
    an adhesive ring that that is interposed between the first and second printed circuits and that surrounds the solder connections; and
    an insulating layer that overlaps the solder connections, wherein the adhesive ring has a central opening, wherein the second printed circuit forms a depression within the opening, and wherein the insulating layer fits within the depression.

12. The apparatus defined in claim 11 further comprising a conductive shielding layer that overlaps the solder connections and the insulating layer.

13. The apparatus defined in claim 12 wherein the conductive shielding layer includes a conductive layer and a layer of conductive adhesive and is configured to fit within the depression.

14. The apparatus defined in claim 12 wherein the conductive shielding layer includes a conductive layer and a layer of conductive adhesive and is attached to portions of the second printed circuit with the layer of conductive adhesive.

* * * * *